US009118460B2

(12) United States Patent
Chen

(10) Patent No.: US 9,118,460 B2
(45) Date of Patent: Aug. 25, 2015

(54) CLOCK AND DATA RECOVERY CIRCUIT

(71) Applicant: FUJITSU LIMITED, Kawasaki-shi, Kanagawa (JP)

(72) Inventor: Yanfei Chen, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/445,171

(22) Filed: Jul. 29, 2014

(65) Prior Publication Data
US 2015/0036774 A1 Feb. 5, 2015

(30) Foreign Application Priority Data

Aug. 1, 2013 (JP) ................................. 2013-160606

(51) Int. Cl.
*H04L 7/04* (2006.01)
*H03M 1/12* (2006.01)

(52) U.S. Cl.
CPC ........ *H04L 7/04* (2013.01); *H03M 1/124* (2013.01)

(58) Field of Classification Search
CPC ..... H04L 7/033; H04L 7/0025; H04L 7/0037; H04L 7/0079; H04L 7/0083; H04L 7/0337; H04L 2027/0053; H04L 2027/0067; H04L 2027/0069; H04L 27/0014; H04L 27/2075; H04L 27/22; H04L 27/2331; H04L 7/00; H04L 7/04
See application file for complete search history.

(56) References Cited

U.S. PATENT DOCUMENTS

| | | | |
|---|---|---|---|
| 7,020,227 B1 * | 3/2006 | Wang et al. ................... | 375/355 |
| 8,138,840 B2 * | 3/2012 | Ainspan et al. ............... | 331/1 A |
| 8,611,473 B1 * | 12/2013 | Warner .......................... | 375/340 |
| 8,791,735 B1 * | 7/2014 | Shibasaki ..................... | 327/156 |
| 8,798,217 B2 * | 8/2014 | Kong et al. ................... | 375/354 |
| 8,837,656 B2 * | 9/2014 | Stojanovic .................... | 375/355 |
| 8,860,467 B2 * | 10/2014 | Malipatil et al. .................. | 327/3 |
| 2001/0031000 A1 | 10/2001 | Nguyen | |
| 2010/0102888 A1 * | 4/2010 | Edwards et al. ................ | 331/16 |
| 2010/0127906 A1 * | 5/2010 | Yamaguchi et al. .......... | 341/131 |
| 2011/0216863 A1 * | 9/2011 | Tomita et al. ................. | 375/371 |
| 2012/0033773 A1 * | 2/2012 | Nedovic ........................ | 375/371 |
| 2012/0200325 A1 * | 8/2012 | Werner ......................... | 327/156 |
| 2015/0043698 A1 * | 2/2015 | Chang et al. ................. | 375/374 |
| 2015/0092898 A1 * | 4/2015 | Lee et al. ...................... | 375/354 |

FOREIGN PATENT DOCUMENTS

JP 2000-077979 3/2000

OTHER PUBLICATIONS

Yamaguchi, H. et al., "A 5Gb/s Transceiver with an ADC-Based Feedforward CDR and CMA Adaptive Equalizer in 65nm CMOS", ISSCC 2010 / Session 8 / High-Speed Wireline Transceivers / 8.7 2010, IEEE International Solid-State Circuits Conference, Digest of Technical Papers (ISSCC), Feb. 9, 2010 (3 pages).

* cited by examiner

Primary Examiner — Hirdepal Singh
(74) Attorney, Agent, or Firm — Fujitsu Patent Center

(57) ABSTRACT

A CDR circuit includes an AD converter that converts an analog input signal to a digital output signal according to an operation clock signal; a phase adjuster that subtracts a first phase from a first clock signal having a first frequency equal to a frequency of the input signal to output a second clock signal having a second frequency as the operation clock signal to the AD converter; a phase detector that detects a second phase in the output signal of the AD converter; a filter that obtains a third phase by performing a filtering process based on the first phase, the second phase, and the third phase output from the filter; an adder that adds the first phase and the third phase to obtain a fourth phase; and a decision circuit that obtains recovered data from the output signal of the AD converter using the fourth phase.

11 Claims, 7 Drawing Sheets

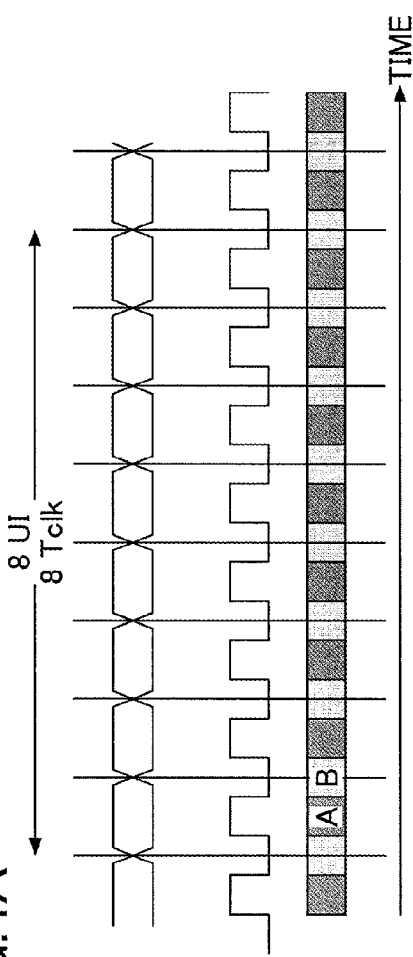
FIG.4A
FIG.4C
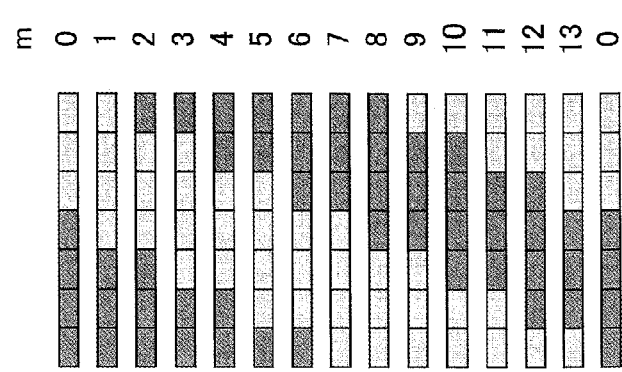
FIG.4B
FIG.4D
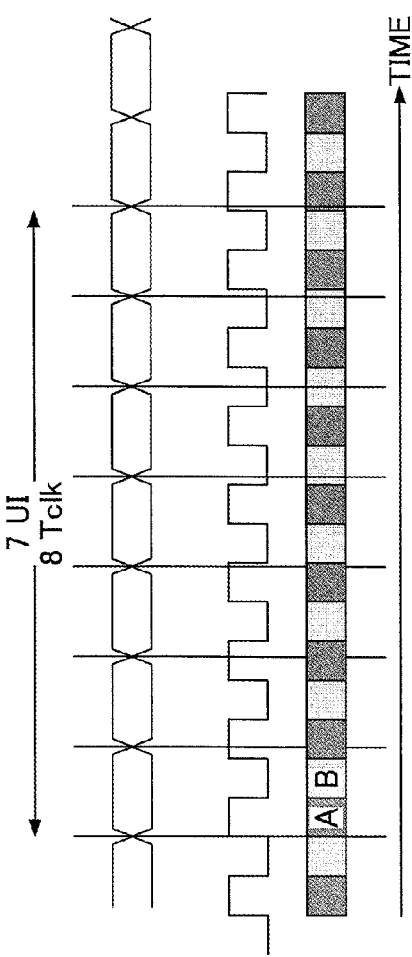

CLOCK AND DATA RECOVERY CIRCUIT

CROSS-REFERENCE TO RELATED APPLICATION

This application is based upon and claims the benefit of priority of Japanese Patent Application No. 2013-160606 filed on Aug. 1, 2013, the entire contents of which are incorporated herein by reference.

FIELD

An aspect of this disclosure relates to a clock and data recovery (CDR) circuit.

BACKGROUND

There exists a method for performing adaptive filtering on a communication signal with a digital filter. In this method, a set of coefficients is used for each "run" of a digital filter, and it is determined whether an output of the digital filter obtained by using the set of coefficients is equal to a selected error level. When the output of the digital filter obtained by using the set of coefficients is not equal to the selected error level, the coefficients are adjusted until the output from the digital filter becomes equal to the selected error level, and the set of adjusted coefficients is stored in a memory. When the digital filter is run later, the set of adjusted coefficients is read from the memory and loaded into the digital filter (see, for example, Japanese Laid-Open Patent Publication No. 2000-077979).

A known 5-Gbps transceiver includes a front end employing an analog-to-digital converter (ADC). The front end extracts an input signal without adjusting the phase difference between the input signal and a sampling clock signal. Phase tracking and data determination of the input signal are performed in a computational domain (see, for example, Yamaguchi, H. "A 5 Gb/s transceiver with an ADC-based feedforward CDR and CMA adaptive equalizer in 65 nm CMOS", 2010 IEEE International Solid-State Circuits Conference, Digest of Technical Papers (ISSCC)).

However, with the related-art method and transceiver described above, it is difficult to detect a phase of a signal with a small phase detection error without increasing the overhead.

SUMMARY

An aspect of this disclosure provides a clock and data recovery circuit including an analog-to-digital converter that converts an analog input signal to a digital output signal according to an operation clock signal; a phase adjuster that subtracts a first phase from a first clock signal having a first frequency equal to a frequency of the input signal to modulate the first clock signal and thereby obtain a second clock signal having a second frequency, and inputs the second clock signal as the operation clock signal to the analog-to-digital converter; a phase detector that detects a second phase included in the output signal of the analog-to-digital converter; a filter that obtains a third phase by performing a filtering process based on the first phase, the second phase detected by the phase detector, and the third phase output from the filter; an adder that adds the first phase and the third phase obtained by the filter to obtain a fourth phase; and a decision circuit that obtains recovered data from the output signal of the analog-to-digital converter using the fourth phase obtained by the adder. In the filtering process, the filter obtains the third phase that minimizes a phase difference between the second phase and the fourth phase.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 4A through 4D are drawings used to describe operations of a blind-sampling CDR circuit of the first embodiment;

DESCRIPTION OF EMBODIMENTS

A related-art blind-sampling clock and data recovery (CDR) circuit 10 is described below with reference to FIGS. 1 and 2.

Figure 1:
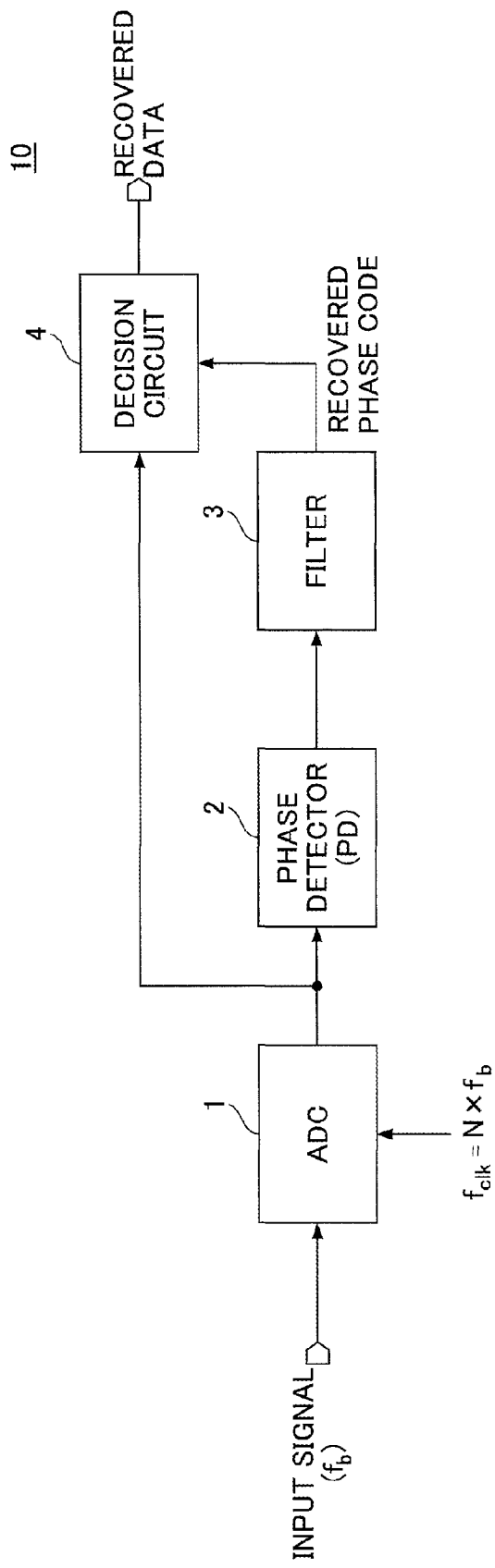
FIG. 1 is a drawing illustrating a related-art blind-sampling CDR circuit.

FIG. 1 is a drawing illustrating the related-art blind-sampling CDR circuit 10.

The blind-sampling CDR circuit 10 may include an analog-to-digital converter (ADC) 1, a phase detector (PD) 2, a filter 3, and a decision circuit 4.

Instead of tracking the phase of an input signal, the blind-sampling CDR circuit 10 extracts phase information from a signal sampled by the ADC 1, and the ADC 1 performs sampling based on the extracted phase information.

In the blind-sampling CDR circuit 10, the ADC 1 converts an input signal into a digital output signal, the phase detector 2 detects the phase of the output signal to obtain a phase signal, the filter 3 generates a recovered phase code by recovering the phase signal, and the decision circuit 4 recovers data included in the sampled signal based on the recovered phase code and the output signal from the ADC 1.

The decision circuit 4 outputs recovered data recovered from the input signal input to the ADC 1.

In the blind-sampling CDR circuit 10, when a change in the signal level is less than the resolution of the ADC 1 in a sampling period (or sampling interval) where a signal zero crossing occurs, a dead zone equal to the sampling interval is generated in a detection result of the phase detector 2.

Figure 2:
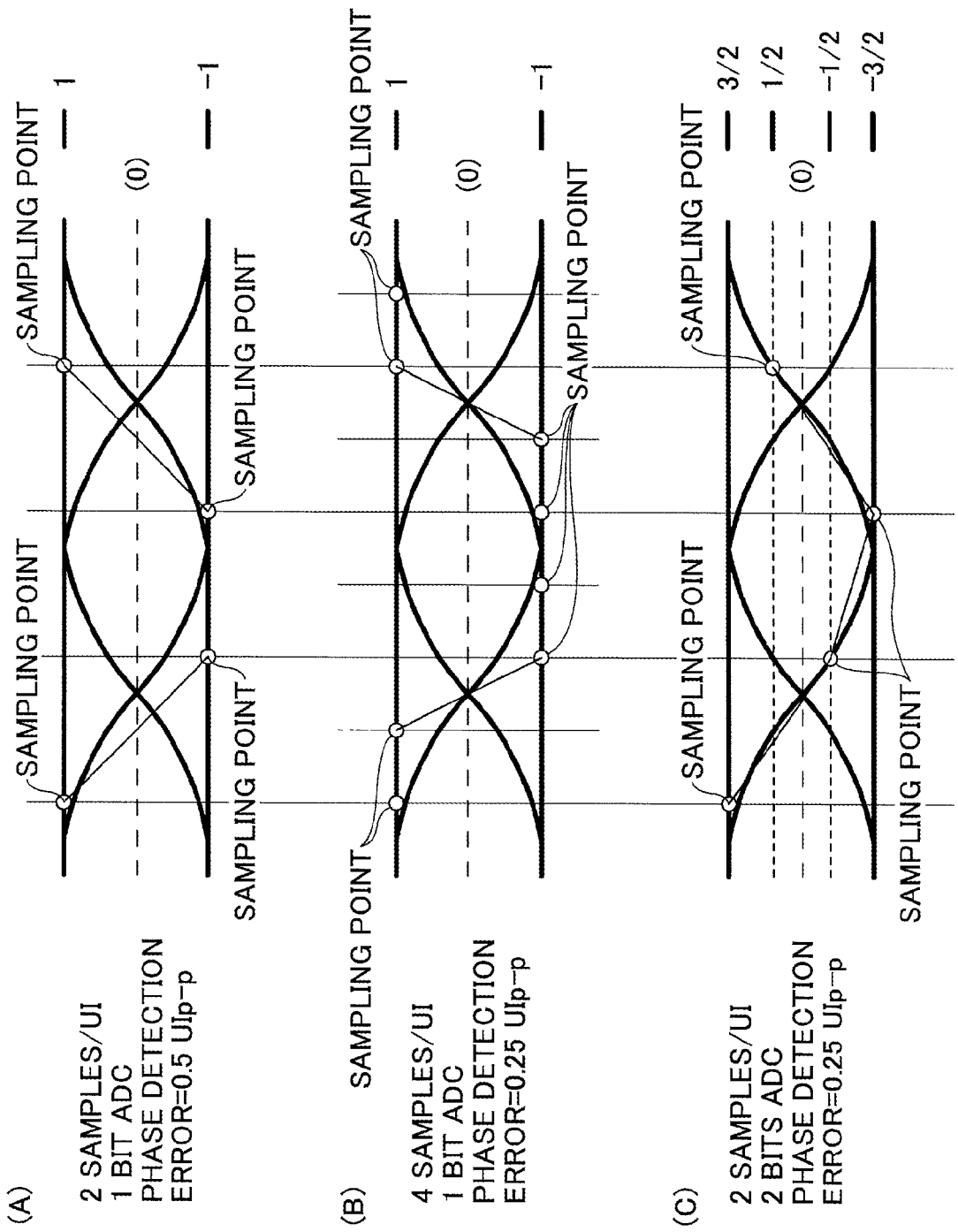
FIG. 2 is a drawing used to describe a phase detection error in a related-art blind-sampling CDR circuit.

FIG. 2 is a drawing used to describe a phase detection error in the blind-sampling CDR circuit 10.

FIG. 2 (A) indicates a phase detection error in a case where a signal is sampled two times in one unit interval (UI) by the blind-sampling CDR circuit 10. In this case, the ADC 1 outputs 1 or 0 using one bit. In FIG. 2 (A), however, the output of the ADC 1 is represented by 1 or −1. A point between 1 and −1 is 0 (zero).

The waveform of a signal from a transmitter becomes blunt while the signal is transmitted through a transmission path. Therefore, an input signal input to the ADC 1 has a sine waveform. While it is not possible to determine the actual phase of the input signal when it crosses an axis representing 0 (zero), it is possible to determine whether a zero crossing point (at which the input signal crosses the axis) is in a first half or a second half of one UI because the zero crossing point is present between two sampling points. Accordingly, in this case, the phase detection error is 0.5 UIp-p.

FIG. 2 (B) indicates a phase detection error in a case where a signal is sampled four times in one UI, which is twice the number of sampling times in FIG. 2 (A). Similarly to the case of FIG. 2 (A), the output of the ADC 1 is represented by one bit.

In this case, because a signal is sampled four times during one UI, the phase detection error is 0.25 UIp-p that is one half of the phase detection error in the case of FIG. 2 (A).

FIG. 2 (C) indicates a phase detection error in a case where a signal is sampled two times in one UI and the output of the ADC 1 is represented by two bits, which is twice the number of bits in FIG. 2 (A).

The two-bit ADC 1 can determine four signal levels: +½, +3/2, −½, and −3/2. A point between +½ and −½ is 0 (zero).

With the two-bit ADC 1, the phase detection error becomes 0.25 UIp-p that is one half of the phase detection error in the case of FIG. 2 (A).

As described above, compared with the case of FIG. 2 (A), the phase detection error can be reduced by increasing the number of sampling times of the ADC 1 as illustrated by FIG. 2 (B) or by increasing the number of bits of the ADC 1 as illustrated by FIG. 2 (C).

However, increasing the number of sampling times and the number of bits of the ADC 1 increases the overhead of analog circuits around the ADC 1.

An aspect of this disclosure provides a CDR circuit that can accurately detect a phase of a signal without increasing the overhead.

Embodiments of the present invention are described below with reference to the accompanying drawings.

First Embodiment

Figure 3:
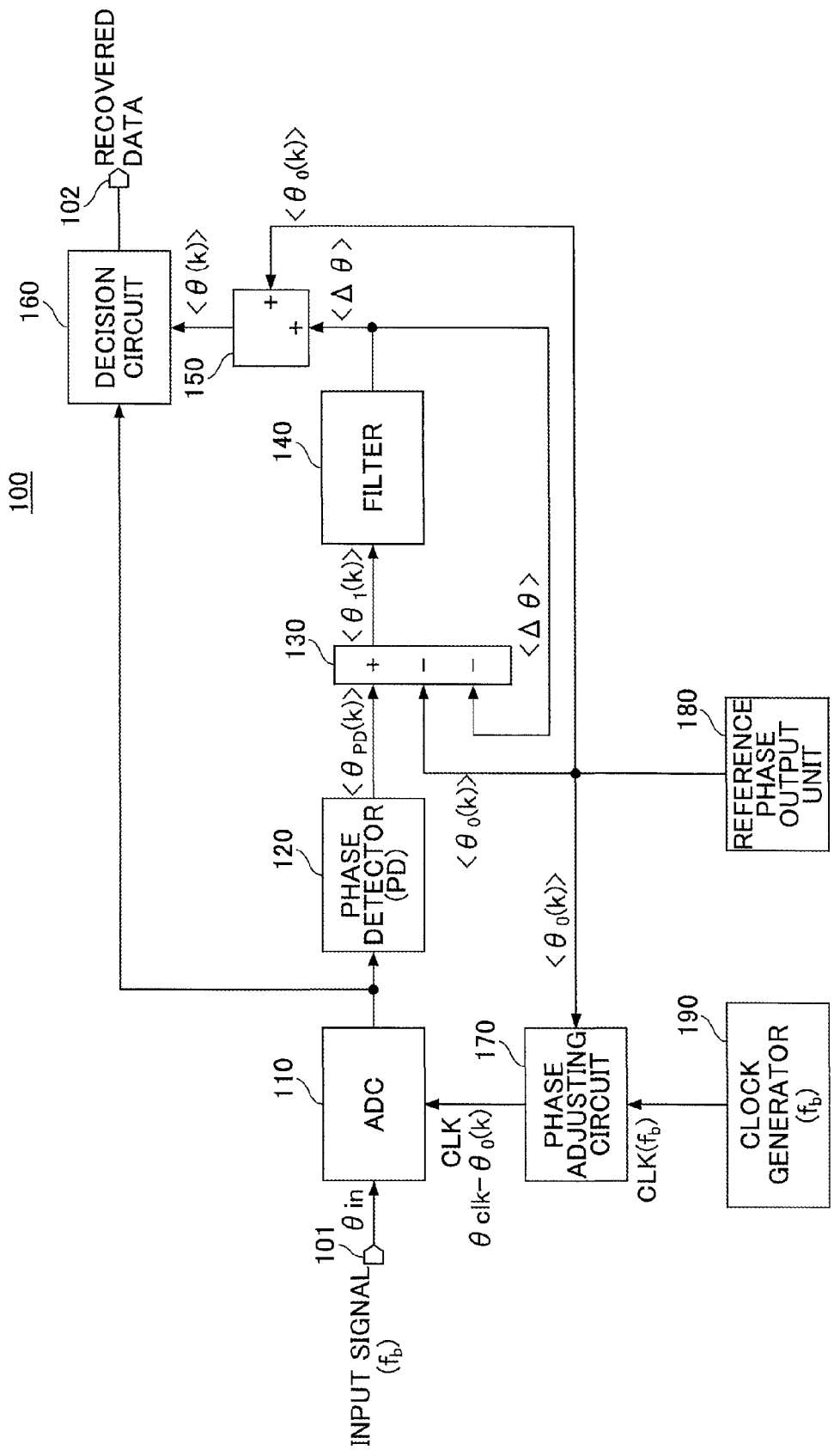
FIG. 3 is a drawing illustrating an exemplary configuration of a blind-sampling CDR circuit of a first embodiment.

FIG. 3 is a drawing illustrating an exemplary configuration of a blind-sampling CDR circuit 100 according to a first embodiment.

The CDR circuit 100 may include an input terminal 101, an output terminal 102, an analog-to-digital converter (ADC) 110, a phase detector (PD) 120, a phase difference output circuit 130, a filter 140, an adder 150, a decision circuit 160, a phase adjusting circuit 170, a reference phase output unit 180, and a clock generator ($f_b$) 190.

In FIG. 3, phase information included in a digital signal is placed in "< >", and a phase of an analog signal is not placed in "< >".

The input terminal 101 is an input unit that receives an input signal that is transmitted via a transmission line of an information processing apparatus including the CDR circuit 100. Thus, the CDR circuit 100 receives data transmitted through a transmission path via the input terminal 101. The symbol rate of the input signal is represented by $f_b$, and the phase of the input signal is represented by θin. When binary modulation is employed, the bit rate is also $f_b$. On the other hand, when a four-level modulation is employed, the bit rate becomes $f_b*2$.

The output terminal 102 is an output unit that output recovered data recovered by the CDR circuit 100. The output terminal 102 is connected to a transmission line of an information processing apparatus including the CDR circuit 100.

The ADC 110 converts data (input signal) input to the input terminal 101 from analog to digital, and thereby generates a series of digital codes (digital signal). The ADC 110 samples the data two times in each data interval (or in each unit interval (UI)) at the rising and falling edges of a clock signal CLK that is input from the phase adjusting circuit 170 as an operation clock signal. This operation of the ADC 110 is similar to the operation of the ADC 1 of the related art. The digital signal output from the ADC 110 is input to the phase detector 120 and the decision circuit 160.

The phase detector 120 detects phase information $θ_{PD}(k)$ of the digital signal output from the ADC 110. The phase information $θ_{PD}(k)$ is included in the digital signal output from the ADC 110. That is, the phase information $θ_{PD}(k)$ indicates an actual measurement of the phase of the input signal that is measured by the phase detector 120. A digital signal representing the phase information $θ_{PD}(k)$ detected by the phase detector 120 is input to the phase difference output circuit 130.

Here, k is an integer from 1 through N, and is incremented by 1 every cycle of the clock signal CLK that is input as an operation clock signal from the phase adjusting circuit 170 to the ADC 110. When k is incremented up to N, k returns to 1. N is a value included in formula (3) described later.

The phase difference output circuit 130 subtracts phase information Δθ included in a digital signal output from the filter 140 and reference phase information $θ_0(k)$ included in a digital signal output from the reference phase output unit 180 from the phase information $θ_{PD}(k)$ detected by the phase detector 120 to obtain phase information $θ_1(k)$, and output a digital signal including the phase information $θ_1(k)$. The phase information $θ_1(k)$ is represented by formula (1) below.

$$θ_1(k)=θ_{PD}(k)−θ_0(k)−Δθ \quad (1)$$

The phase information $θ_1(k)$ output from the phase difference output circuit 130 is input to the filter 140.

The filter 140 performs an approximation process based on a least-squares method on sets of phase information $θ_1(k)$ that is output from the phase difference output circuit 130 every cycle of the clock signal CLK to obtain the phase information Δθ, and outputs a digital signal including the phase information Δθ. The phase information Δθ indicates the smallest phase difference between the phase information $θ_{PD}(k)$ detected by the phase detector 120 and phase information θ(k) output as a phase code from the adder 150, and is obtained by an approximation process based on a least-squares method. The phase information Δθ included in the digital signal output from the filter 140 is input to the phase difference output circuit 130 and the adder 150. Details of the approximation process based on the least-squares method are described later.

The adder 150 adds the phase information Δθ output from the filter 140 and the reference phase information $θ_0(k)$ output from the reference phase output unit 180 to obtain the phase information θ(k) represented by formula (2) below, and outputs a digital signal including the phase information θ(k).

$$θ(k)=Δθ+θ_0(k) \quad (2)$$

The phase information θ(k) output from the adder 150 is input to the decision circuit 160.

That is, the phase information θ(k) is a phase code extracted from the input signal input to the input terminal 101.

The decision circuit 160 recovers the output signal of the ADC 110 using the phase information θ(k) (phase code) output from the adder 150 to obtain recovered data, and outputs the recovered data.

The phase adjusting circuit 170 outputs the clock signal CLK that is obtained by adjusting the phase of a clock signal CLK($f_b$) output from the clock generator 190. The phase adjusting circuit 170 subtracts a reference phase $\theta_0(k)$ output from the reference phase output unit 180 from a phase signal θclk of the clock signal CLK($f_b$) by performing digital-to-analog conversion. As a result, the phase signal of the clock signal CLK output from the phase adjusting circuit 170 becomes θclk−$\theta_0(k)$. The phase adjusting circuit 170 may be implemented, for example, by a phase interpolator or a delay control circuit.

The frequency of the clock signal CLK($f_b$) output from the clock generator 190 is $f_b$ and is equal to the frequency $f_b$ of the input signal. Therefore, when the reference phase $\theta_0(k)$ is a positive value, a frequency fclk of the clock signal CLK output from the phase adjusting circuit 170 is higher than the frequency $f_b$ of the clock signal CLK($f_b$).

The reference phase information $\theta_0(k)$ output from the reference phase output unit 180 is a periodic function whose period corresponds to N clock cycles. An index k (k=1, 2, . . . , N) is assigned to each clock cycle. The cycle of the clock signal CLK ($f_b$) before modulation is represented by $T_b=1/f_b$.

The reference phase output unit 180 outputs the reference phase information $\theta_0(k)$. The reference phase information $\theta_0(k)$ is a periodic function that is represented, for example, by formula (3) below.

$$\theta_0(k) = k \times \Delta f \times T_b \qquad (3)$$

In formula (3), "cycle slip" is not taken into account. A cycle slip indicates an event where the apparent number of data units in a clock cycle periodically decreases (fclk>fdata) or increases (fclk<fdata) due to a frequency offset between a data signal and a clock signal.

Δf in formula (3) is represented by Δf=fclk−fb.

Accordingly, a period of 7 UI of data of the input signal having the same frequency as the frequency of the clock signal CLK($f_b$) is equal to a period of eight cycles (8 Tclk) of the clock signal CLK input from the phase adjusting circuit 170 to the ADC 110.

In other words, a period of eight cycles (8 T) of the clock signal CLK($f_b$) output from the clock generator 190 is equal to a period of 8 UI of data of the input signal having the same frequency as the frequency of the clock signal CLK($f_b$).

Thus, a period of eight cycles (8 Tclk) of the clock signal CLK input from the phase adjusting circuit 170 to the ADC 110 is equal to a period of 7 UI of data of the input signal having the same frequency as the clock signal CLK($f_b$).

Therefore, the frequency fclk of the clock signal CLK output from the phase adjusting circuit 170 is 8/7 times greater than the frequency $f_b$ of the clock signal CLK($f_b$) output from the clock generator 190. That is, the frequency fclk is represented by fclk=(8/7)×$f_b$.

As described above, in the first embodiment, the frequency fclk of the clock signal CLK input to the ADC 110 is modulated.

The reference phase output unit 180 is a circuit that can output a digital signal including the reference phase information $\theta_0(k)$.

The clock generator 190 outputs the clock signal CLK($f_b$) having the frequency $f_b$ that is equal to the frequency of the input signal. The clock generator 190 may be implemented, for example, by a phase locked loop (PLL).

An approximation process performed by the filter 140 based on a least-squares method is described below.

The phase information Δθ output from the filter 140 indicates the smallest phase difference between the phase information $\theta_{PD}(k)$ detected by the phase detector 120 and the phase information θ(k) output as a phase code from the adder 150. The phase information Δθ is obtained by an approximation process based on a least-squares method as described below.

The approximation process based on the least-squares method is performed to obtain the phase information Δθ that minimizes a square sum E(Δθ) of a difference between the phase information θ(k) output as a phase code from the adder 150 and the phase information $\theta_{PD}(k)$ detected by the phase detector 120. When k is 1 through N, E(Δθ) is obtained by formula (4) below.

$$E(\Delta\theta) = \sum_{k=1}^{N} S(k)[\theta(k) - \theta_{PD}(k)]^2 = \sum_{k=1}^{N} S(k)[\theta_0(k) + \Delta\theta - \theta_{PD}(k)]^2 \qquad (4)$$

Formula (5) below is obtained by differentiating formula (4) with respect to Δθ and setting E(Δθ) at 0 (zero).

$$\sum_{k=1}^{N} S(k)[\theta_0(k) + \Delta\theta - \theta_{PD}(k)] = 0 \qquad (5)$$

Accordingly, when formula (6) below is not 0 (zero), the phase Δθ is obtained by formula (7). $N_{edge}$ of formula (6) indicates the number of data edges (transition points) observed in N clock cycles. In formula (6), S(k) is 1 when a data edge is present in the interval k, and S(k) is 0 when no data edge is present in the interval k.

$$N_{edge} = \sum_{k=1}^{N} S(k) \qquad (6)$$

$$\Delta\theta = \frac{\sum_{k=1}^{N} S(k)[\theta_{PD}(k) - \theta_0(k)]}{\sum_{k=1}^{N} S(k)} \qquad (7)$$

Formula (7) indicates that the phase information Δθ is obtained as an average of differences between the phase information $\theta_{PD}(k)$ output from the phase detector 120 and the reference phase information $\theta_0(k)$ output from the reference phase output unit 180.

The filter 140 may be configured such that calculations (filtering process) to obtain Δθ represented by formula (7) are performed by a loop formed by the filter 140 and the phase difference output circuit 130.

FIGS. 4A through 4D are drawings used to describe operations of the blind-sampling CDR circuit 100 of the first embodiment. Before describing operations of the blind-sampling CDR circuit 100 of the first embodiment, operations of the related-art blind-sampling CDR circuit 10 are described with reference to FIGS. 4A and 4B.

When sampling is performed n times, an n-phase clock signal is used. In the example of FIGS. 4A through 4D, it is assumed that sampling is performed two times, and an ADC with a resolution of 1 bit is used. When blind sampling is performed with an ADC having a resolution of 1 bit, a phase detector (PD) only determines whether a data edge is present between adjacent sampling points.

FIG. 4A is a timing chart illustrating input data and a clock signal of the related-art blind-sampling CDR circuit 10. In FIG. 4A, "A" below the waveform of the clock signal CLK indicates a period when the clock signal CLK is high (H), and "B" indicates a period when the clock signal CLK is low (L). The period A is indicated by dark gray, and the period B is indicated by light gray.

In FIG. 4A, one UI of data is equal to one cycle (Tclk) of the clock signal CLK. That is, the frequency $f_b$ of data equals the frequency fclk of the clock signal CLK ($f_b$=fclk). Accordingly, data units of 8 UI are sampled during a period of 8 Tclk.

In the first Tclk of 8 Tclk, the transition point of the data is located in the center of the period B of the clock signal CLK. Therefore, in all of the second through eighth Tclk, the transition point of the data is in the center of the period B.

Thus, the transition points of all eight data units are included in the corresponding periods B. FIG. 4B illustrates combinations (or patterns) of periods A and B where the respective transition points of eight data units (8 UI) are present, in a case where the frequency $f_b$ of data is equal to the frequency fclk of the clock signal CLK ($f_b$=fclk).

In the above described case where the transition points of all of eight data units are included in the periods B, eight periods B are lined up as illustrated in the lower part of FIG. 4B.

In a different case where the transition points of all of eight data units are included in the periods A, eight periods A are lined up as illustrated in the upper part of FIG. 4B.

FIG. 4B illustrates combinations of periods A and B where the respective transition points of eight data units are present. When the frequency $f_b$ of the data is equal to the frequency fclk of the clock signal CLK ($f_b$=fclk), the transition points of eight data units are all included in the periods A (the upper part of FIG. 4B) or in the periods B (the lower part of FIG. 4B).

On the other hand, as illustrated by FIG. 4C, in the blind-sampling CDR circuit 100 (see FIG. 3) of the first embodiment, the phase of the clock signal CLK to be input to the ADC 110 is shifted (or modulated) by 1/7 of the frequency $f_b$ of the data with respect to the frequency $f_b$. Accordingly, the frequency fclk of the clock signal CLK to be input to the ADC 110 is 8/7 $f_b$. In other words, the frequency fclk of the clock signal CLK is modulated by 1/7 of the frequency $f_b$ of the data.

When the frequency fclk of the clock signal CLK to be input to the ADC 110 is 8/7 $f_b$, data units of 7 UI are sampled during a period of 8 Tclk as illustrated by FIG. 4C. Accordingly, in FIG. 4C, a period of 7 UI of data is equal to a period of eight cycles (8 Tclk) of the clock signal CLK.

In FIG. 4C, "A" below the waveform of the clock signal CLK indicates a period when the clock signal CLK is high (H), and "B" indicates a period when the clock signal CLK is low (L). The period A is indicated by dark gray, and the period B is indicated by light gray.

One UI of data in FIG. 4C is longer than one UI of data in FIG. 4A, and one cycle of the clock signal CLK in FIG. 4C is the same as one cycle of the clock signal CLK in FIG. 4A.

In FIG. 4C, the transition point of the first data unit in 7 UI is located at the beginning of the period A of the clock signal CLK. The transition points of the second through fourth data units in 7 UI become gradually closer to the end of the period A.

The transition point of the fifth data unit in 7 UI is located near the beginning of the period B of the clock signal CLK. The transition points of the sixth and seventh data units of 7 UI become gradually closer to the end of the period B.

Thus, in FIG. 4C, each of the transition points of seven data units is present in the period A or the period B of the clock signal CLK. In this case, as illustrated by FIG. 4D, there are 14 combinations of periods A and B (or phase patterns) where the transition points of seven data units (7 UI) are present.

FIG. 4D illustrates combinations (or patterns) of periods A and B where the transition points of seven data units are present, in a case where the frequency fclk of the clock signal CLK to be input to the ADC 110 is shifted with respect to the frequency $f_b$ of data by 1/7 of the frequency $f_b$ (fclk=8/7 $f_b$).

The uppermost pattern in FIG. 4D illustrates a case where the transition points of seven data units (7 UI) are present, respectively, in periods A, A, A, A, B, B, and B, which corresponds to the case of FIG. 4C.

The 14 patterns illustrated by FIG. 4D include seven patterns where the location of the transition point of data changes from the period A to the period B, and seven patterns where the location of the transition point of data changes from the period B to the period A. In FIG. 4D, pattern numbers m=0 through 13 are assigned to the 14 patterns.

FIG. 4D illustrates all possible patterns of the locations of the transition points that may be observed when the frequency fclk of the clock signal CLK to be input to the ADC 110 is shifted with respect to the frequency $f_b$ of data by 1/7 of the frequency $f_b$ (fclk=8/7 $f_b$).

In practice, however, because transition of data occurs at particular timing with respect to the phase of the clock signal CLK, the actual pattern of periods A and B (phase pattern) of the clock signal CLK where the transition points of seven data units (7 UI) appear becomes one of the 14 patterns illustrated by FIG. 4D. The 14 patterns with pattern numbers m=0 through 13 are provided for descriptive purposes.

In FIG. 4C, the clock signal CLK may be a differential clock signal.

Figure 5B:
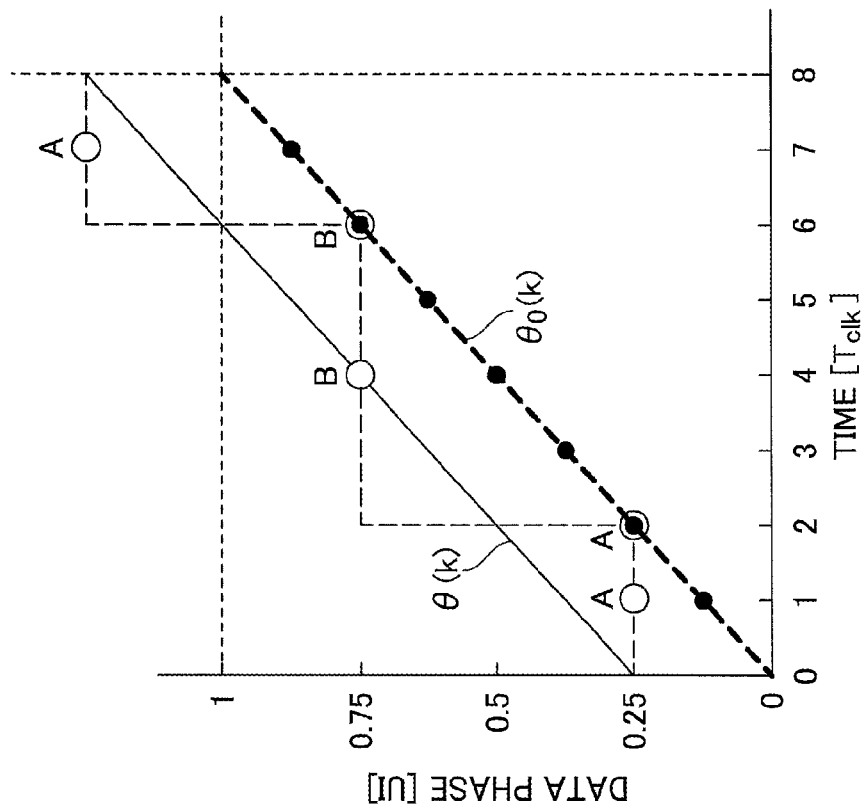
FIGS. 5A and 5B are graphs used to describe an exemplary method of obtaining a straight line using a least-squares method by a blind-sampling CDR circuit of the first embodiment.
Figure 5A:
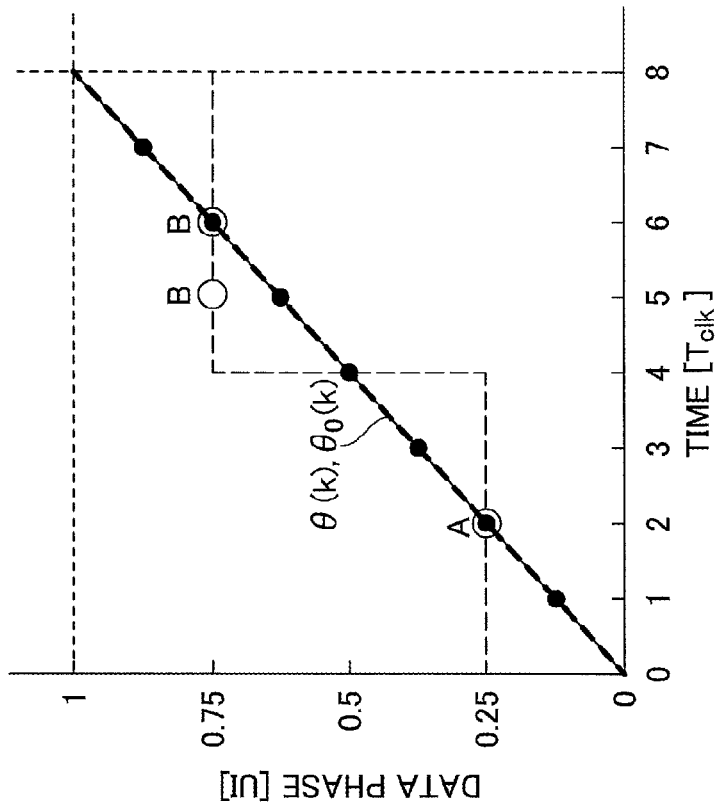

FIGS. 5A and 5B are graphs used to describe an exemplary method of obtaining a straight line using a least-squares method by the CDR circuit 100 of the first embodiment. FIGS. 5A and 5B illustrate straight lines θ(k) that are obtained by performing an approximation process based on a least-squares method on different patterns of data.

In FIGS. 5A and 5B, the horizontal axis indicates time in units of clock cycles (Tclk) that are represented by integers (k), and the vertical axis indicates a data phase in units of UI.

When sampling is performed n times in one UI, an n-phase clock signal is used. In the example of FIGS. 5A and 5B, it is assumed that sampling is performed two times, and the resolution of the ADC 110 is 1 bit. When blind sampling is performed with the ADC 110 having a resolution of 1 bit, the phase detector (PD) 120 only determines whether a data edge is present between adjacent sampling points.

Also in FIGS. 5A and 5B, it is assumed that the output $\theta_{PD}(k)$ of the phase detector 120 is 0.25 UI when the transition point of data is present in the period A, and the output $\theta_{PD}(k)$ of the phase detector 120 is 0.75 UI when the transition point of data is present in the period B.

In FIG. 5A, it is assumed that a transition point of data is observed in the period A when k=2, and transition points of data are observed in the period B when k=5, 6. The transition points are indicated by "○".

When Δθ obtained by formula (7) above is 0 (zero), according to formula (2) above, the phase information θ(k) output from the adder 150 equals the reference phase information $\theta_0(k)$. That is, $\theta(k)=\theta_0(k)$ is true.

In this case, the decision circuit 160 recovers the output signal of the ADC 110 using the reference phase information $\theta_0(k)$ as the phase information $\theta(k)$ (phase code) output from the adder 150 to obtain recovered data, and outputs the recovered data. This method or configuration makes it possible to make the phase detection error less than 0.5 UIp-p.

In FIG. 5B, it is assumed that transition points of data are observed in the period A when k=1, 2, 7, and transition points of data are observed in the period B when k=4, 6. The transition points are indicated by "○".

When $\Delta\theta$ obtained by formula (7) above is 0.25 UI, according to formula (2) above, the phase information $\theta(k)$ output from the adder 150 is represented by $\theta(k)=\theta_0(k)+0.25$ UI.

In this case, the decision circuit 160 recovers the output signal of the ADC 110 using $\theta(k)=\theta_0(k)+0.25$ UI as the phase information $\theta(k)$ (phase code) output from the adder 150 to obtain recovered data, and outputs the recovered data. This method or configuration makes it possible to make the phase detection error less than 0.5 UIp-p.

As described above, the CDR circuit 100 of the first embodiment can make the phase detection error less than 0.5 UIp-p without increasing the number of sampling times and the number of bits of the ADC 110.

Thus, the first embodiment makes it possible to provide a CDR circuit that can detect a phase of a signal with a small phase detection error without increasing the overhead.

Figure 6:
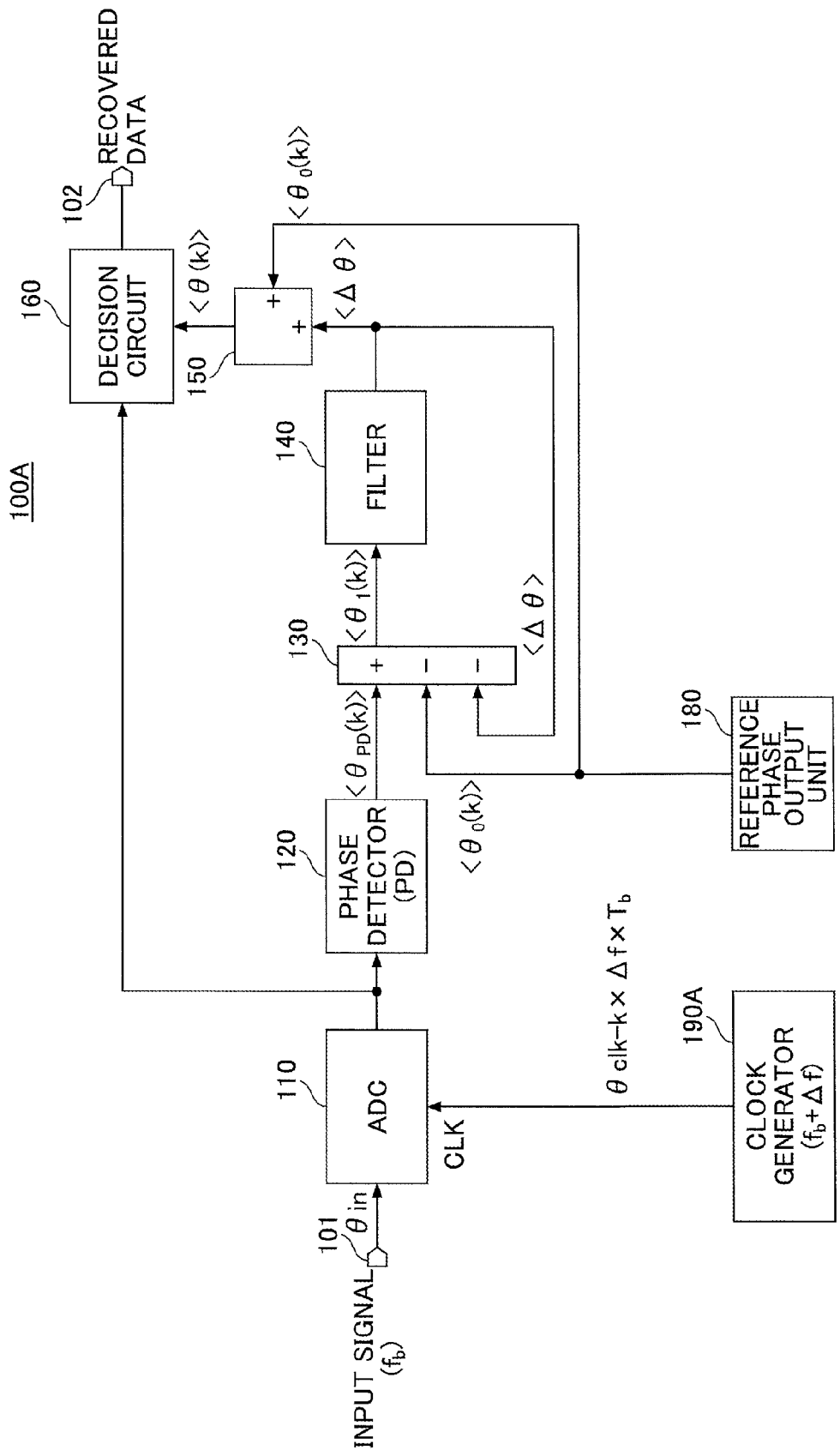
FIG. 6 is a drawing illustrating an exemplary configuration of a blind-sampling CDR circuit of a variation of the first embodiment.

In the first embodiment, the CDR circuit 100 includes the phase adjusting circuit 170. However, a CDR circuit may have a different configuration. FIG. 6 is a drawing illustrating an exemplary configuration of a blind-sampling CDR circuit 110A of a variation of the first embodiment.

The CDR circuit 100A of FIG. 6 does not include the phase adjusting circuit 170 (see FIG. 3). Instead, the CDR circuit 100A includes a clock generator ($f_b+\Delta f$) 190A that outputs a clock signal CLK with a frequency of $f_b+\Delta f$ that corresponds to the phase signal $\theta \text{clk}-\theta_0(k)$ of the clock signal CLK output from the phase adjusting circuit 170 of FIG. 3. Thus, the combination of the phase adjusting circuit 170 and the clock generator 190 of FIG. 3 may be replaced with the clock generator 190A. The clock generator 190A outputs a clock signal CLK having a phase $\theta \text{clk}-k \times \Delta f \times T_b$.

Second Embodiment

Figure 7A:
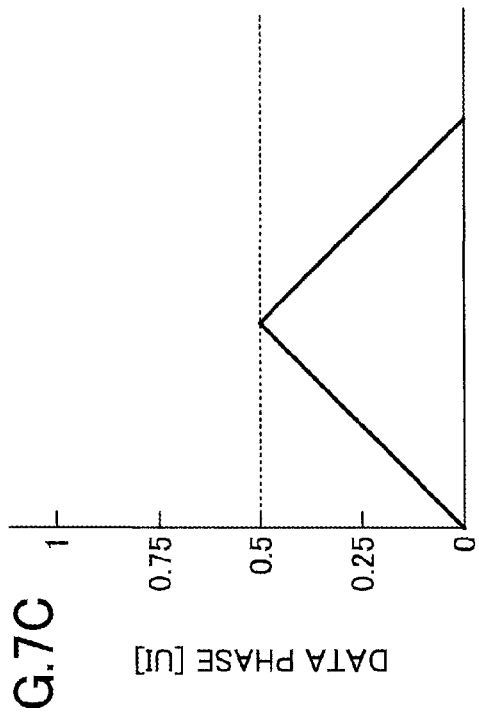
FIG. 7A is a drawing illustrating a part of a CDR circuit of a second embodiment.
Figure 7C:
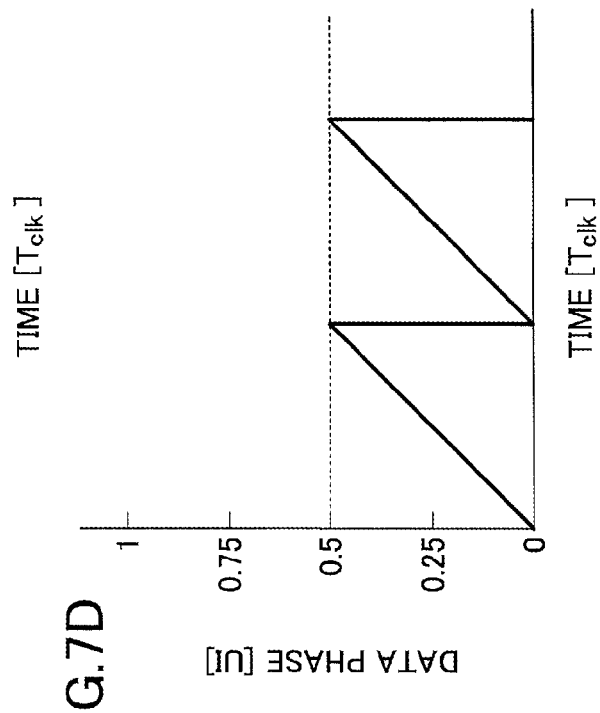
FIGS. 7B through 7D are waveform charts of a CDR circuit of the second embodiment.
Figure 7B:
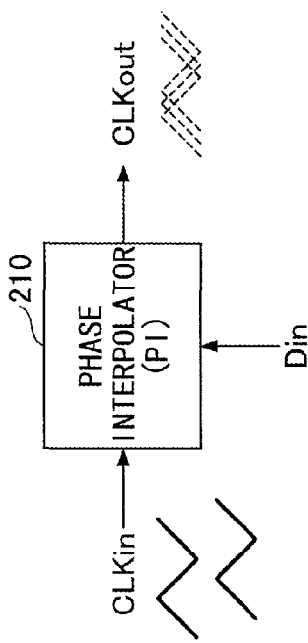
Figure 7D:
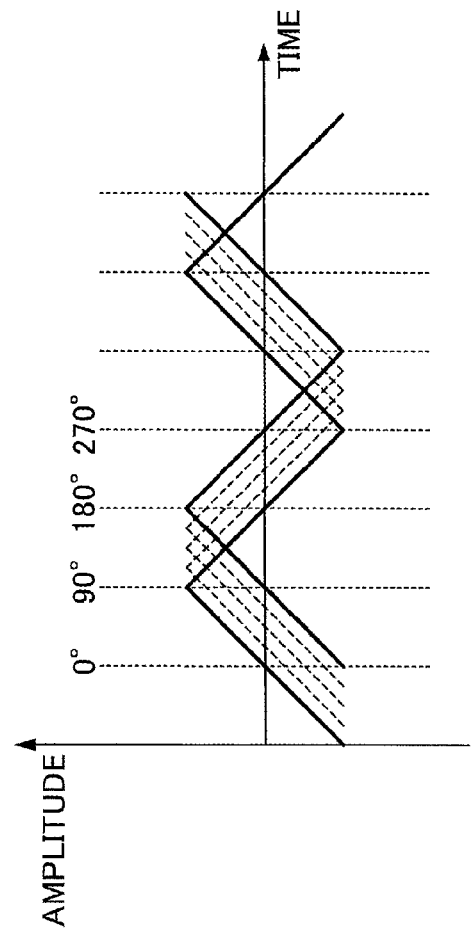

FIG. 7A is a drawing illustrating a part of a CDR circuit of a second embodiment, and FIGS. 7B through 7D are waveform charts of the CDR circuit of the second embodiment.

A phase interpolator (PI) 210 illustrated in FIG. 7A interpolates a phase of an input clock signal CLKin according to a control signal Din, and outputs an output clock signal CLKout with a desired phase as illustrated in FIG. 7B.

In this case, the phase interpolator 210 may be configured to use a digital signal $<\theta_0(k)>$ corresponding to the reference phase information $\theta_0(k)$ as the control signal Din, use the clock signal CLK($f_b$) input from the clock generator 190 as the input clock signal CLKin, and output the output clock signal CLKout as the operation clock signal CLK of the ADC 110.

The CDR circuit of the second embodiment can also make the phase detection error less than 0.5 UIp-p without increasing the number of sampling times and the number of bits of the ADC 110.

Thus, the second embodiment also makes it possible to provide a CDR circuit that can detect a phase of a signal with a small phase detection error without increasing the overhead.

In FIGS. 7A and 7B, the input clock signal CLKin and the output clock signal CLKout have a triangular waveform. Alternatively, the input clock signal CLKin and the output clock signal CLKout may have a ramp waveform as illustrated by FIG. 7C or a sawtooth waveform as illustrated by FIG. 7D.

CDR circuits according to embodiments of the present invention are described above. However, the present invention is not limited to the specifically disclosed embodiments, and variations and modifications may be made without departing from the scope of the present invention.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A clock and data recovery circuit, comprising:
   an analog-to-digital converter that converts an analog input signal to a digital output signal according to an operation clock signal;
   a phase adjuster that subtracts a first phase from a first clock signal having a first frequency equal to a frequency of the input signal to modulate the first clock signal and thereby obtain a second clock signal having a second frequency, and inputs the second clock signal as the operation clock signal to the analog-to-digital converter;
   a phase detector that detects a second phase included in the output signal of the analog-to-digital converter;
   a filter that obtains a third phase by performing a filtering process based on the first phase, the second phase detected by the phase detector, and the third phase output from the filter;
   an adder that adds the first phase and the third phase obtained by the filter to obtain a fourth phase; and
   a decision circuit that obtains recovered data from the output signal of the analog-to-digital converter using the fourth phase obtained by the adder,
   wherein in the filtering process, the filter obtains the third phase that minimizes a phase difference between the second phase and the fourth phase.

2. The clock and data recovery circuit as claimed in claim 1, wherein the first phase is represented by a periodic function.

3. The clock and data recovery circuit as claimed in claim 2, wherein the first phase linearly changes every cycle of the first clock signal.

4. The clock and data recovery circuit as claimed in claim 1, further comprising:
   a phase signal output unit that outputs a signal having the first phase.

5. The clock and data recovery circuit as claimed in claim 1, wherein the phase adjuster is implemented by a phase interpolator.

6. The clock and data recovery circuit as claimed in claim 1, further comprising:
   a phase difference detector that is disposed between the phase detector and the filter, obtains a phase difference by subtracting the first phase and the third phase from the second phase, and inputs the obtained phase difference to the filter.

7. A clock and data recovery circuit, comprising:
an analog-to-digital converter that converts an analog input signal having a first frequency to a digital output signal according to an operation clock signal;
a clock generator that generates a clock signal having a second frequency that is different from the first frequency of the input signal by a frequency difference corresponding to a first phase, and inputs the generated clock signal as the operation clock signal to the analog-to-digital converter;
a phase detector that detects a second phase included in the output signal of the analog-to-digital converter;
a filter that obtains a third phase by performing a filtering process based on the first phase, the second phase detected by the phase detector, and the third phase output from the filter;
an adder that adds the first phase and the third phase obtained by the filter to obtain a fourth phase; and
a decision circuit that obtains recovered data from the output signal of the analog-to-digital converter using the fourth phase obtained by the adder,
wherein in the filtering process, the filter obtains the third phase that minimizes a phase difference between the second phase and the fourth phase.

8. The clock and data recovery circuit as claimed in claim 7, wherein the first phase is represented by a periodic function.

9. The clock and data recovery circuit as claimed in claim 8, wherein the first phase linearly changes every cycle of the first clock signal.

10. The clock and data recovery circuit as claimed in claim 7, further comprising:
a phase signal output unit that outputs a signal having the first phase.

11. The clock and data recovery circuit as claimed in claim 7, further comprising:
a phase difference detector that is disposed between the phase detector and the filter, obtains a phase difference by subtracting the first phase and the third phase from the second phase, and inputs the obtained phase difference to the filter.

* * * * *